United States Patent
Chittipeddi et al.

[19]

[11] Patent Number: 6,017,787
[45] Date of Patent: Jan. 25, 2000

[54] INTEGRATED CIRCUIT WITH TWIN TUB

[75] Inventors: Sailesh Chittipeddi, Austin, Tex.; William Thomas Cochran, Clermont, Fla.; Stephen Knight, Gaithersburg, Md.

[73] Assignee: Lucent Technologies Inc., Murray Hill, N.J.

[21] Appl. No.: 08/775,490

[22] Filed: Dec. 31, 1996

[51] Int. Cl.$^7$ ............................................. H01L 21/8238
[52] U.S. Cl. ..................... 438/228; 438/232; 438/514; 438/224
[58] Field of Search .................................. 438/228, 229, 438/230, 231, 232, 233, 234, 301, 303, 305, 306, 307, FOR 168, FOR 177, 217, 514, 624, 669

[56] References Cited

U.S. PATENT DOCUMENTS

| | | | |
|---|---|---|---|
| 4,435,896 | 3/1984 | Parrillo et al. | 438/217 |
| 4,558,508 | 12/1985 | Kinney et al. | 438/228 |
| 4,584,027 | 4/1986 | Metz, Jr. et al. | 438/527 |
| 5,141,882 | 8/1992 | Komori et al. | 438/228 |
| 5,300,797 | 4/1994 | Bryant et al. | 438/228 |
| 5,413,944 | 5/1995 | Lee | 438/228 |
| 5,422,312 | 6/1995 | Lee et al. | 438/624 |
| 5,460,984 | 10/1995 | Yoshida | 438/228 |
| 5,478,759 | 12/1995 | Mametani | 438/228 |
| 5,540,812 | 7/1996 | Kadomura | 438/669 |
| 5,573,962 | 11/1996 | Sung | 438/228 |
| 5,573,963 | 11/1996 | Sung | 438/228 |
| 5,628,871 | 5/1997 | Shinagawa | 438/514 |
| 5,670,395 | 9/1997 | Pan | 438/451 |

FOREIGN PATENT DOCUMENTS

| | | |
|---|---|---|
| 0181501A | 10/1985 | European Pat. Off. . |
| 0564191A | 3/1993 | European Pat. Off. . |
| 56013722A | 2/1981 | Japan . |
| 04083335A | 3/1992 | Japan . |
| 7-45713 | 7/1993 | Japan . |
| 07045713A | 2/1995 | Japan . |

OTHER PUBLICATIONS

Patent Abstracts of Japan, vol. 095, No. 005, Jun. 30,1995–& JP 07 045713A (Kawasaki Steel Corp.) Feb. 14, 1995.

Patent Abstracts of Japan, vol. 005, No. 063 (E–054), Apr. 28, 1981 & JP 56 013722A (Matsushita Electric Ind Co Ltd), Feb. 10, 1981.

Patent Abstracts of Japan, vol. 016, No. 303 (E–1228), Jul. 3, 1992 & JP 04 083335A (Fujitsu Ltd.), Mar. 17, 1992.

*Primary Examiner*—Wael Fahmy
*Assistant Examiner*—Khanh Duong
*Attorney, Agent, or Firm*—Martin G. Meder; John T. Rehberg; Scott W. McLellan

[57] ABSTRACT

A twin tub integrated circuit and method for its formation are disclosed. A portion of the substrate is covered by photoresist while an n region is formed, illustratively, by ion implantation. Then the n region is covered with a protective material, illustratively a spin on glass or another photoresist. The previously-formed photoresist is removed and a p-type implant is performed to create an p region. When all the protective layers are removed, both regions have upper surfaces which are co-planar. The co-planar surfaces, a departure from previous practice, make submicron lithography easier. The regions are annealed to form twin tubs.

9 Claims, 4 Drawing Sheets

INTEGRATED CIRCUIT WITH TWIN TUB

TECHNICAL FIELD

This invention relates to integrated circuits with twin tubs and methods for their manufacture.

BACKGROUND OF THE INVENTION

Many CMOS integrated circuits utilize a substrate with twin tubs. One tub is typically doped with an n-type dopant, while the other tub is doped with a p-type dopant. An example of a twin tub patent is found in U.S. Pat. No. 4,435,896, issued to Parillo et al.

An artifact of some twin tub manufacturing processes is a height difference between the upper silicon surface of n tub and the p tub. In other words, the silicon surface of the p tub is not co-planar with the silicon surface of the n tub. This lack of co-planarity may contribute to difficulties in achieving proper stepper focus as integrated circuitry dimensions shrink. (Subsequent attempts to remove or reduce the lack of co-planarity may require extra masks and incur extra costs.)

Those concerned with the development of integrated circuits have consistently sought new and improved methods for forming twin tubs within a semiconductor substrate.

SUMMARY OF THE INVENTION

Illustratively, the present invention includes depositing a first material overlying a first surface of a substrate;

implanting one or more first conductivity type dopants through a second surface of the substrate;

depositing a second material overlying the second surface of the substrate;

implanting one or more second conductivity type dopants through the first surface of the substrate.

DETAILED DESCRIPTION

Figure 1:
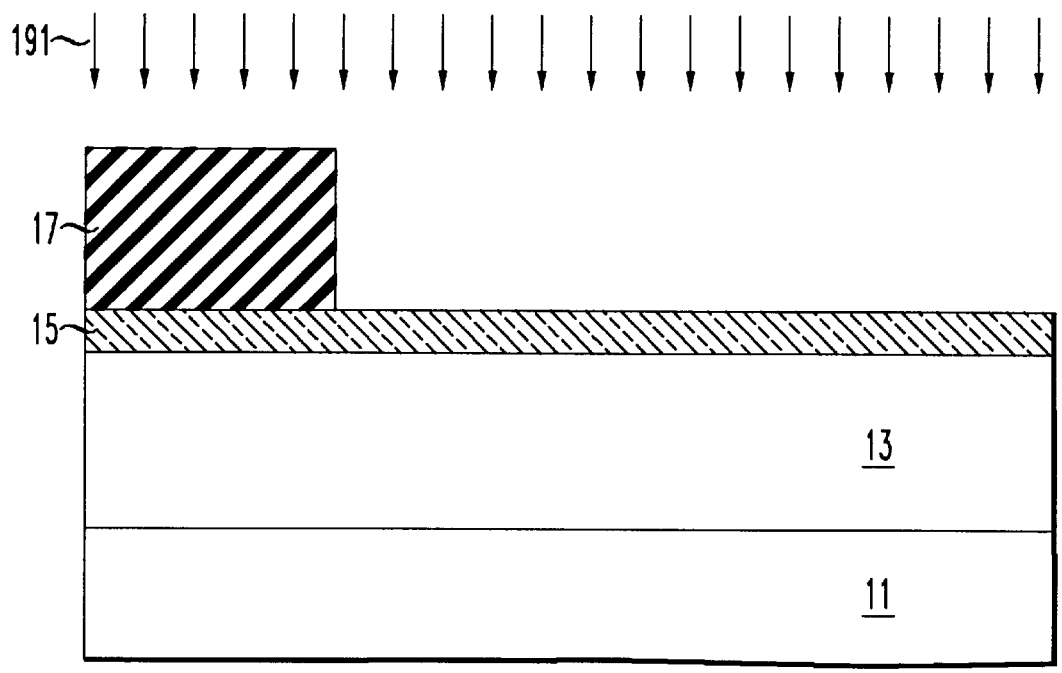
FIGS. 1–8 are cross-sectional views of useful in understanding illustrative embodiments of the present invention.

In FIG. 1, reference numeral 11 illustratively denotes a p-type substrate. (However, substrate 11 may be n-type or intrinsic also.) In general, the term substrate refers to a material upon which other materials may be formed. Other suitable substrates are gallium arsenide and its alloys, gallium nitride, etc. Indium phosphide and its alloys may also be a suitable substrate. Reference numeral 13 denotes, illustratively, an optional layer of p-type epitaxial material, illustratively having a thickness between 2 and 15 microns. Reference numeral 15 denotes a pad oxide layer illustratively having a thickness between 350–450 Å. Pad oxide 15 may illustratively be formed by exposure of substrate 11 to an oxidizing ambient at a temperature of approximately 1000°. Other methods are possible and known to those skill in the art. Reference numeral 17 denotes a photoresist which has been patterned to cover and protect a portion of the substrate.

After deposition of photoresist 17, an optional removal of a portion of exposed pad oxide 15 may be performed to provide a clean upper oxide surface. Illustratively, 0.5 microns of pad oxide 15 may be removed in a plasma etch.

Next, an ion implantation 191 of either one or more different n-type species is performed. Optionally, two separate implants of the same n-type species may be performed. Illustratively, a first shallow implant of phosphorus may be performed followed by a second deeper implant of arsenic. Illustratively, each of the implants may be performed at energies between 0 and 300 KeV and dosage ranges between 1E11 to 5E16/cm$^2$. Appropriate species, energies and dosages may be chosen by those of skill in the art depending upon the types of circuits desired.

Figure 2:
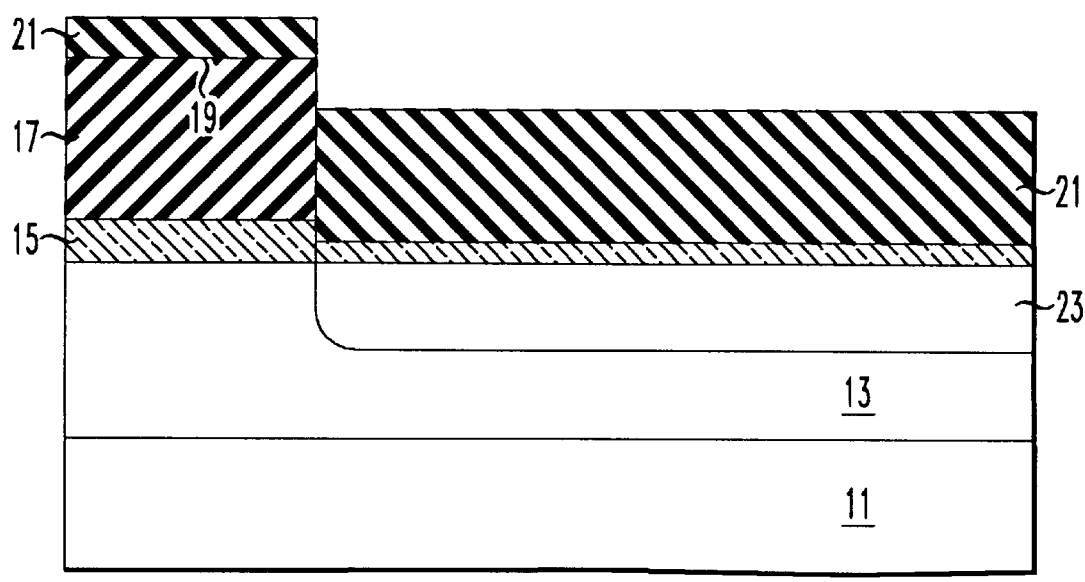

Turning to FIG. 2, the n-type implant species within epitaxial layer 13 are denoted by reference numeral 23.

FIG. 2 shows that the portion of the pad oxide 15 over region 23 has been reduced by the optional plasma etch mentioned above. The region denoted by reference numeral 23 will, upon subsequent annealing, become the n-tub.

Next, a protective material 21 is deposited principally over the already-implanted n region 23. A portion of protective layer 21 may also be deposited upon upper surface 19 of photoresist 17. Suitable protective materials are: spin on glass, polyimide, titanium nitride formed by spin-on processes, planarized low temperature glass and any other material with an etch rate differential with respect to photoresist 17. The thickness of protective material 21 is chosen so that material 21 is capable of protecting n tub 23 from subsequently implanted p-type species as will be explained below.

Illustratively, protective material 21 may be blanket deposited and then the entire wafer planarized with chemical-mechanical polishing (CMP), or a deposit-etch-deposit etc. process may be performed.

After protective material 21 has been formed over region 23 (which will become the n-tub after anneal), any portion of protective material 21 which is formed on upper surface 19 of photoresist 17 is removed by a light clean-up etch or CMP, etc.

Figure 3:
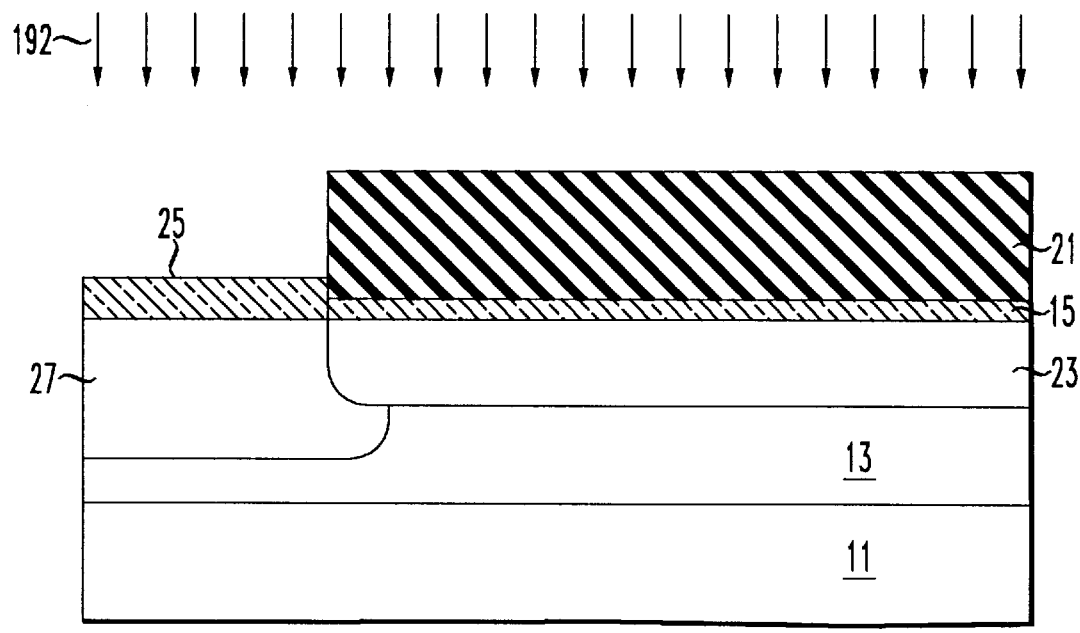

Turning to FIG. 3, photoresist 17 has been removed. After appropriate cleaning procedures have been performed on the upper surface 25 of oxide 15, one or two p-type dopant species are implanted into epitaxial layer 13. Illustratively, two separate boron implants, one implant being deep, the other shallow, are performed thereby creating a P region 27. As depicted here, P region 27 is slightly deeper than n region 23, although this need not be always necessarily true.

Figure 4:
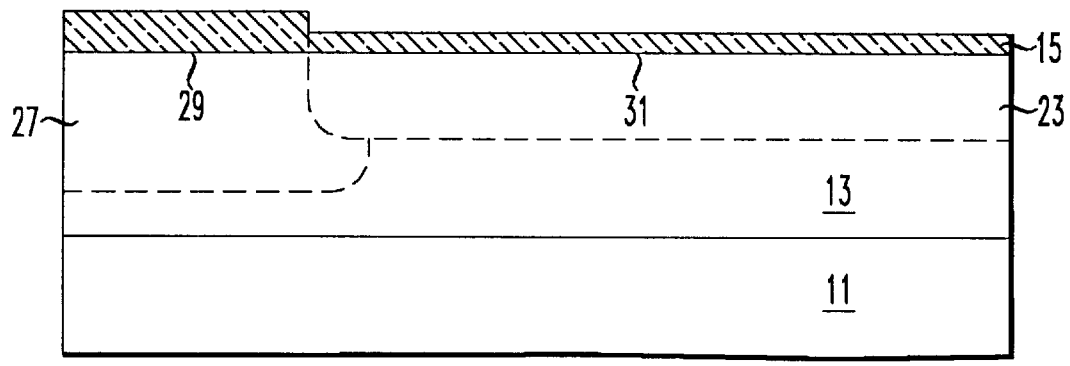
Figure 5:
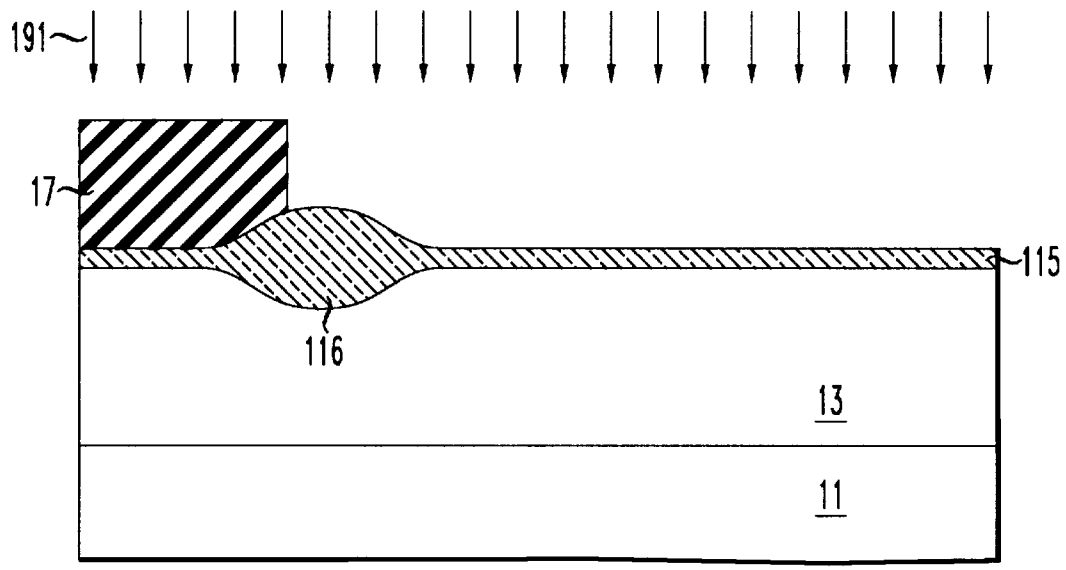

Turning to FIG. 4, protective material 21 is removed. It will be noted, by examination of FIG. 4, that when oxide layer 15 is removed, that the upper surface 31 of n tub 23 is co-planar with upper surface 29 of p tub 27.

Further processing according to standard methods may proceed at this point. P region 27 and a region 23 may be annealed to create corresponding p tubs and n tubs. Field oxides may be defined by LOCOS or poly-buffered LOCOS or other processes known in the art. Then gates may be defined and dielectric layers and metallization formed.

FIGS. 5–8 illustrate another embodiment of the invention in which the field oxide has been formed prior to tub definition. For example, in FIG. 5, reference numeral 11 denotes a substrate, while reference numeral 13 denotes an optional epitaxial overlayer. Reference numeral 115 denotes a pad oxide layer, while reference numeral 116 denotes a field oxide. Field oxide 116 may, illustratively, be formed by a LOCOS process or a poly-buffered LOCOS process. Reference numeral 17 denotes a photoresist which is patterned to cover and protect a portion of the substrate. Again, an optional removal of a portion of exposed pad oxide 115 may be performed. Then an ion implantation 191 of one or more different implant species is performed. Illustrative implant energies and dosages have already been described.

Figure 6:
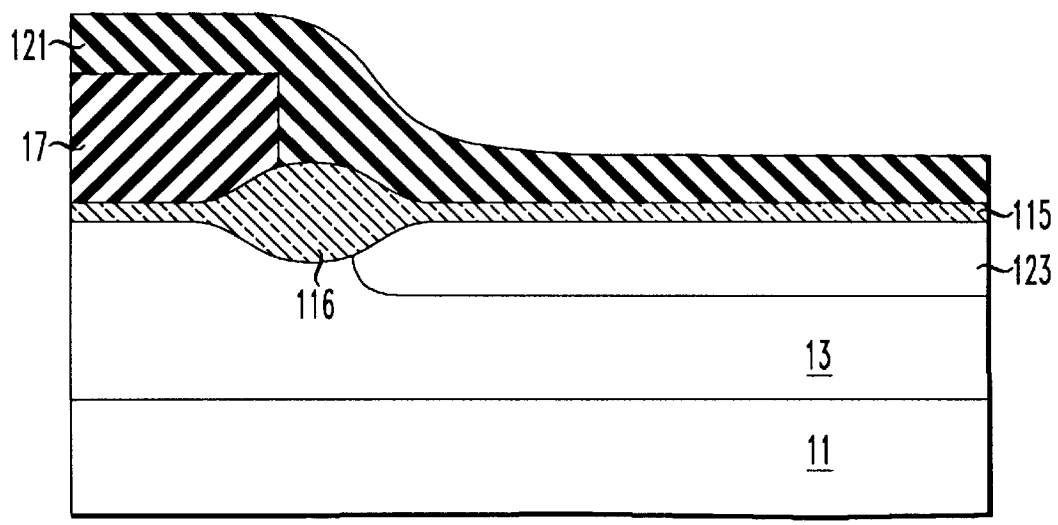

Turning to FIG. 6, the implant species define region 123. Next, a protective material 121 is deposited. Suitable candidate materials for protective material 121 have already been discussed.

Figure 7:
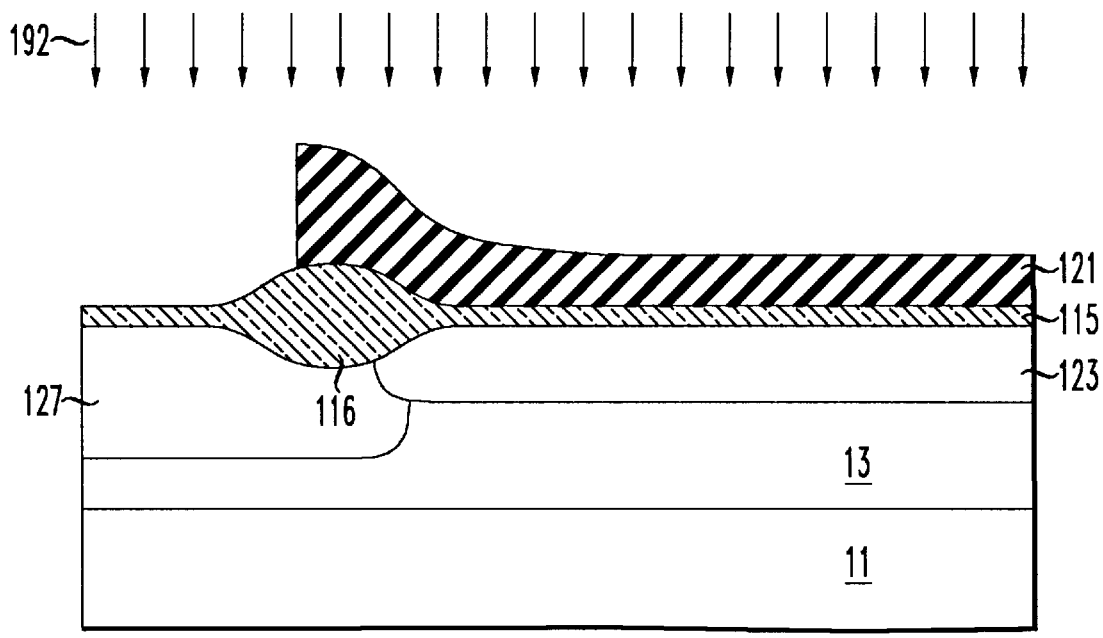
Figure 8:
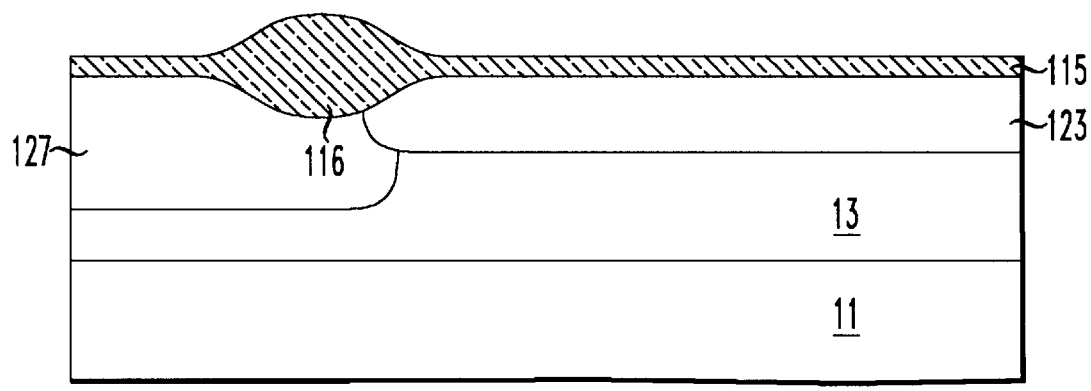

In FIG. 7, photoresist 17, together with any overlying material has been removed. One or two dopant species 192 is then implanted to form region 127. After appropriate heat treatment after removal of material 121, regions 123 and 127 may be annealed to form complementary tubs, as shown in FIG. 8. Further processing according to standard methods may proceed at this point. Gates may define and dielectric layers and metallization formed.

The invention claimed is:

1. A method of integrated circuit fabrication comprising:

depositing a first material overlying a first surface of a substrate comprising a pad oxide layer;

removing a portion of the pad oxide;

implanting one or more first type species through a second surface of said substrate;

depositing a second material overlying the first material and said second surface of said substrate, wherein said second material is protective;

removing said first material; and implanting one or more second type species through said first surface of said substrate.

2. The method of claim 1 in which said first material is photoresist.

3. The method of claim 1 in which said substrate is silicon.

4. The method of claim 1 in which said second material is chosen from the group consisting of spin on glass, polyimide, titanium nitride, and planarized low temperature glass.

5. The method of claim 1 in which said first type species is an n-type species.

6. The method of claim 5 in which said second type species is a p-type species.

7. The method of claim 1 wherein the first material is photoresist and said photoresist has an etch rate differential with respect to said second material.

8. A method of integrated circuit fabrication comprising:

depositing a first material overlying a first surface of a substrate comprising a field oxide layer, wherein the field oxide is partially covered by the first material;

implanting one or more first type species through a second surface of said substrate;

depositing a second material overlying the first material and said second surface of said substrate, wherein said second material is protective;

removing said first material; and implanting one or more second type species through said first surface of said substrate.

9. A method of making an integrated circuit including coplanar twin tubs comprising the steps of:

providing a semiconductor substrate including a planar semiconductor inner region and a surface comprising an oxide layer;

depositing a first material layer on a first surface portion of the oxide layer;

removing a portion of the oxide layer from a second surface portion of the oxide layer, the second surface portion adjacent the first surface portion;

implanting a first conductivity type species through the second surface portion, the first material layer masking the first surface portion from the implanting;

depositing a second material layer on the first material layer and the second surface portion, the second material layer having an etch rate differential with respect to the first material layer so as to protect the second surface portion during removal of the first material layer;

etching away the first material layer;

implanting a second conductivity type species through the first surface portion of the oxide layer, the second material layer masking the second surface portion from the implanting, annealing the substrate to produce coplanar twin tubs in the semiconductor inner region underlying the first and second surface regions.

\* \* \* \* \*